US007640069B1

(12) United States Patent
Johnston

(10) Patent No.: US 7,640,069 B1

(45) Date of Patent: Dec. 29, 2009

(54) EDITING AUDIO DIRECTLY IN FREQUENCY SPACE

(75) Inventor: David E. Johnston, Duvall, WA (US)

(73) Assignee: Adobe Systems Incorporated, San Jose, CA (US)

( * ) Notice: Subject to any disclaimer, the term of this patent is extended or adjusted under 35 U.S.C. 154(b) by 472 days.

(21) Appl. No.: 11/395,044

(22) Filed: Mar. 30, 2006

(51) Int. Cl.

*G06F 17/00* (2006.01)
*G06F 3/00* (2006.01)
*H03G 5/00* (2006.01)
*H04R 5/02* (2006.01)

(52) U.S. Cl. .......................... 700/94; 381/98; 381/306; 715/716

(58) Field of Classification Search .................. 381/98, 381/100; 715/716, 727
See application file for complete search history.

(56) References Cited

OTHER PUBLICATIONS

Adobe, Adobe Audition version 1.5 New Feature Highlights, 2004, web.archive.org, Apr. 26, 2004 version, entire document.*

The GIMP Documentation Team, "GNU Image Manipulation Program User Manual", Mar. 10, 2005, Version 2.2, section 3-2.1, entire document.*

Cedar Retouch for Sadie, [online] [retrieved on Oct. 26, 2006]. Retrieved from the Internet <URL: http://www.cedaraudio.com>.

Chargeable plugins, Cedar Retouch™, [online] [retrieved on Mar. 28, 2006]. Retrieved from the Internet <URL: www.sadie.com/products/plugins/plugsins_retouch.htm>.

Chargeable plugins, Cedar De-Noise96, [online] [retrieved on Mar. 28, 2006]. Retrieved from the Internet <URL: www.sadie.com/products/plugins/plugins_noise.html>.

Adobe Systems Incorporated. *Chapter 4: Editing Audio* in: "Adobe® Audition™ 1.5 User Guide", pp. 83-116, May 2004.

* cited by examiner

*Primary Examiner*—Curtis Kuntz
*Assistant Examiner*—Jesse A Elbin
(74) *Attorney, Agent, or Firm*—Fish & Richardson P.C.

(57) ABSTRACT

Systems and methods for audio editing are provided. In one implementation, a computer-implemented method is provided. The method includes displaying audio data in a visual form. A user input is received demarcating an arbitrary region within the visual display of the audio data. A portion of the audio data is isolated corresponding to the region demarcated by the user. The isolated portion of the audio data is edited and the edited audio data is mixed into the audio data to create edited audio data.

34 Claims, 9 Drawing Sheets

300

800

EDITING AUDIO DIRECTLY IN FREQUENCY SPACE

BACKGROUND

The present disclosure relates to audio editing.

Audio data can be displayed in a number of different formats. The different display formats are commonly used to illustrate different properties of the audio data. For example, a frequency spectrogram display format shows various frequencies of the audio data in the time-domain (e.g., a graphical display with time on the x-axis and frequency on the y-axis). Similarly, an amplitude display format shows audio intensity in the time-domain (e.g., a graphical display with time on the x-axis and intensity on the y-axis).

Audio data can be edited. For example, the audio data may include noise or other unwanted components. Removing these unwanted components improves audio quality (i.e., the removal of noise components provides a clearer audio signal). Alternatively, a user may apply different processing operations to portions of the audio data to generate particular audio effects.

Audio editing by frequency, for example, typically involves filtering over a rectangular region of the displayed audio data having a constant frequency band. To perform an effect on an audio data directed to component frequencies below 200 Hz, for example, a low-pass filter is applied to the audio data. The low-pass filter removes the components of the audio data at or above 200 Hz while leaving the components of the audio data below 200 Hz intact. This remaining audio data is then processed to create a desired effect (e.g., an echo effect). The original audio data is then filtered again with a high-pass filter. The high-pass filter removes the components of the original audio data below 200 Hz. The processed audio components (i.e., the portion below 200 Hz after processing) are then recombined, or mixed, with the remaining original audio data to generate edited audio data having the applied effect.

SUMMARY

In general, in one aspect a computer-implemented method is provided. The computer-implemented method includes displaying audio data in a visual form. A user input is received demarcating an arbitrary region within the visual display of the audio data. A portion of the audio data is isolated corresponding to the region demarcated by the user. The isolated portion of the audio data is edited and the edited audio data is mixed into the audio data to create edited audio data.

In general, in another aspect, a computer program product, encoded on a computer-readable medium, is provided. The computer program product is operable to cause data processing apparatus to perform operations. The performed operations include displaying audio data in a visual form. A user input is received demarcating an arbitrary region within the visual display of the audio data. A portion of the audio data is isolated corresponding to the region demarcated by the user. The isolated portion of the audio data is edited and the edited audio data is mixed into the audio data to create edited audio data.

Implementations of the method and computer program product can optionally include one or more of the following features. Isolating the portion of the audio data can include dividing the region into blocks and processing each block. Processing each block can include defining a window function for the block and performing a Fourier transform on the audio data over the time of the block to extract frequency components. The processing of each block can also include applying the window to the Fourier transform results to remove extracted frequency components external to the block and performing an inverse Fourier transform to provide a time domain isolated block audio data corresponding only to the audio data of the block. The isolated block audio data for each block are combined to generate the isolated audio data for the demarcated region.

Dividing the demarcated regions into blocks can include creating overlapping rectangular blocks having a predefined width in time and a height corresponding to the frequency range of the demarcated region at that time. Windowing the block defines a function that is zero-valued outside the boundary of the window. The window boundary can substantially match the width of the block and the height of the demarcated region for block time. Applying the window function to the Fourier transform results can remove all frequency components outside the defined window. Displaying the audio data can include generating a frequency spectrogram display. Editing the isolated audio data includes applying one or more effects to the isolated audio data. Mixing the edited isolated audio data includes subtracting the isolated audio data of the demarcated region from the displayed audio data and adding the edited audio data into the displayed audio data. The editing operations can be performed directly within the display of the audio data.

In general, in one aspect, an apparatus is provided. The apparatus includes a display region for displaying audio data of an audio file. The apparatus also includes one or more selection tools for selecting an arbitrary region within a particular displayed audio data. One or more editing tools are also included for directly editing a portion of the audio data contained within the selected region of the displayed audio data.

Systems and methods for audio editing are described. An audio editing application can display audio data in various formats including intensity, frequency, and pan position. A user interface displays the audio data in a particular format. The user can select an arbitrary region of the displayed audio data to select an arbitrary portion of the audio data. One or more editing operations are performed on the selected audio data within the selected portion. The edited results are then mixed into the audio data to provide an edited result.

Particular embodiments of the invention can be implemented to realize one or more of the following advantages. A user can select an arbitrary region of a displayed audio data to select an arbitrary portion of the audio data for editing. By drawing a selection region directly on the displayed audio data, the user can visually identify and isolate a portion of the audio data for editing. The arbitrary selection within the displayed audio data allows the user to track particular audio features, which may vary in the time-domain, for example, by frequency. Tailoring the selected region to a particular portion of the audio data allows the user to perform finely tuned frequency edits. Since the user defines an arbitrary region tailored to a particular portion of the audio data, the selected region minimizes selection of audio data outside of the target audio.

The selected region is isolated so that the user can edit directly in an audio display without extracting the selected portion of the audio data into a new window, thus providing all the user interface tools available in the main display window that may not be available in a newly generated editing window. Additionally, directly editing audio components within the displayed audio data simplifies the audio editing process. For example, the complexity of extracting a non-rectangular selection of audio data (i.e., audio data with a variable frequency band over time) into a new window is avoided. Furthermore, user edits to the displayed audio data seamlessly edits the underlying audio file.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
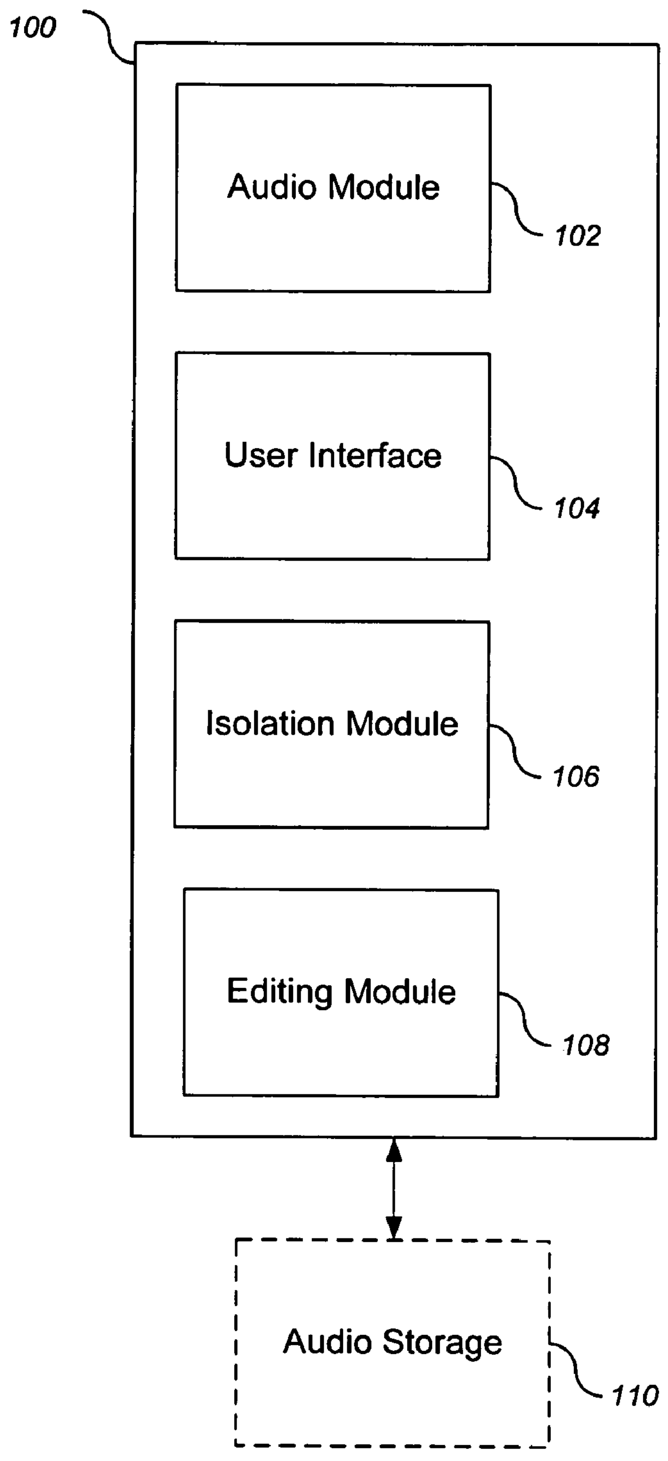
FIG. 1 is a block diagram of an example audio editing system.

FIG. 1 is a block diagram of an example audio editing system 100 for use in performing editing operations on audio data. The audio editing system 100 includes an audio module 102, a user interface 104, an isolation module 106, and an editing module 108.

Audio module 102 analyzes a received audio file and extracts the audio data. Audio files can be received by the audio module 102 from audio storage within the audio system 100, from an external source such as audio storage 110, or otherwise. The extracted audio data is then displayed in the user interface 104. The audio module 102 analyzes the audio file to display the audio data in a particular display format, for example, as a frequency spectrogram.

Audio storage 110 can be one or more storage devices, each of which can be locally or remotely located. The audio storage 10 responds to requests from the audio editing system 100 to provide particular audio files to the audio module 102.

The user interface 104 provides a graphical interface for displaying audio data. For example, the user interface 104 displays a frequency spectrogram of the audio data using information received from the audio module 102. The user interface 104 also allows the user to identify and request a particular audio file. Additionally, the user interface 104 provides various tools and menus that a user can use to interact with the displayed audio data.

In one implementation of the user interface 104, the tools include one or more selection tools allowing the user to select a region of the displayed audio data. For example, geometric selection tools such as a rectangle tool, a circle tool, or a tool of another geometric shape can be positioned and sized within the displayed audio data to select a particular region. Additionally, the user can select a region using drawing tools such as a lasso tool or other freehand drawing tool that allow the user to select an arbitrary portion of the audio data. The selected region can be symmetric or non-symmetric depending on the type of tool used. Furthermore, the user can use one or more tools to select an arbitrary region of the displayed audio data corresponding to audio data having a variable frequency range over time (i.e., the height of the selected region varies).

Additionally, automatic selection tools can be used to select a region of the displayed audio data. For example, a threshold tool can be used to select a predefined region corresponding to audio data surrounding a user selected point in the audio display that exceeds a threshold decibel level. Another automatic selection tool can be used to select particular user identified audio data using the selection tool as well as harmonic audio data associated with the user selected audio data. Furthermore, other selection tools can be used to automatically apply a particular effect to the audio data corresponding to the user selected region. For example, a paintbrush tool which selects and performs a particular effect (e.g., feathering) to the audio data corresponding to strokes of the paintbrush.

The user interface 104 also includes one or more editing tools or menus for performing editing operations on the portion of the audio data within (i.e., corresponding to) the selected region of the displayed audio data. For example, the editing tools can define a number of different editing effects to perform on the portion of the audio data.

The isolation module 106 isolates the selected portion of the audio data displayed in the user interface 104. The isolation module 106 processes the selected region to isolate the portion of the audio data defined by the selected region. Once isolated from the rest of the displayed audio data, one or more editing operations can be performed on the isolated audio data.

The editing module 108 performs one or more editing operations on the isolated audio data. Editing operations can be performed in response to a user input, for example, though user interactions with the user interface 104. Editing operations can include the removal of the isolated audio data from the displayed audio data as well as the processing of the isolated audio data to generate one or more particular effects. For example, audio effects include amplifying, pitch shifting, flanging, reversing, and attenuating. Additionally, the isolated audio data can be copied and pasted to a different portion of the displayed audio data. The edited version of the isolated audio data is mixed with the original audio data to produce an edited version of the original audio data.

Figure 2:
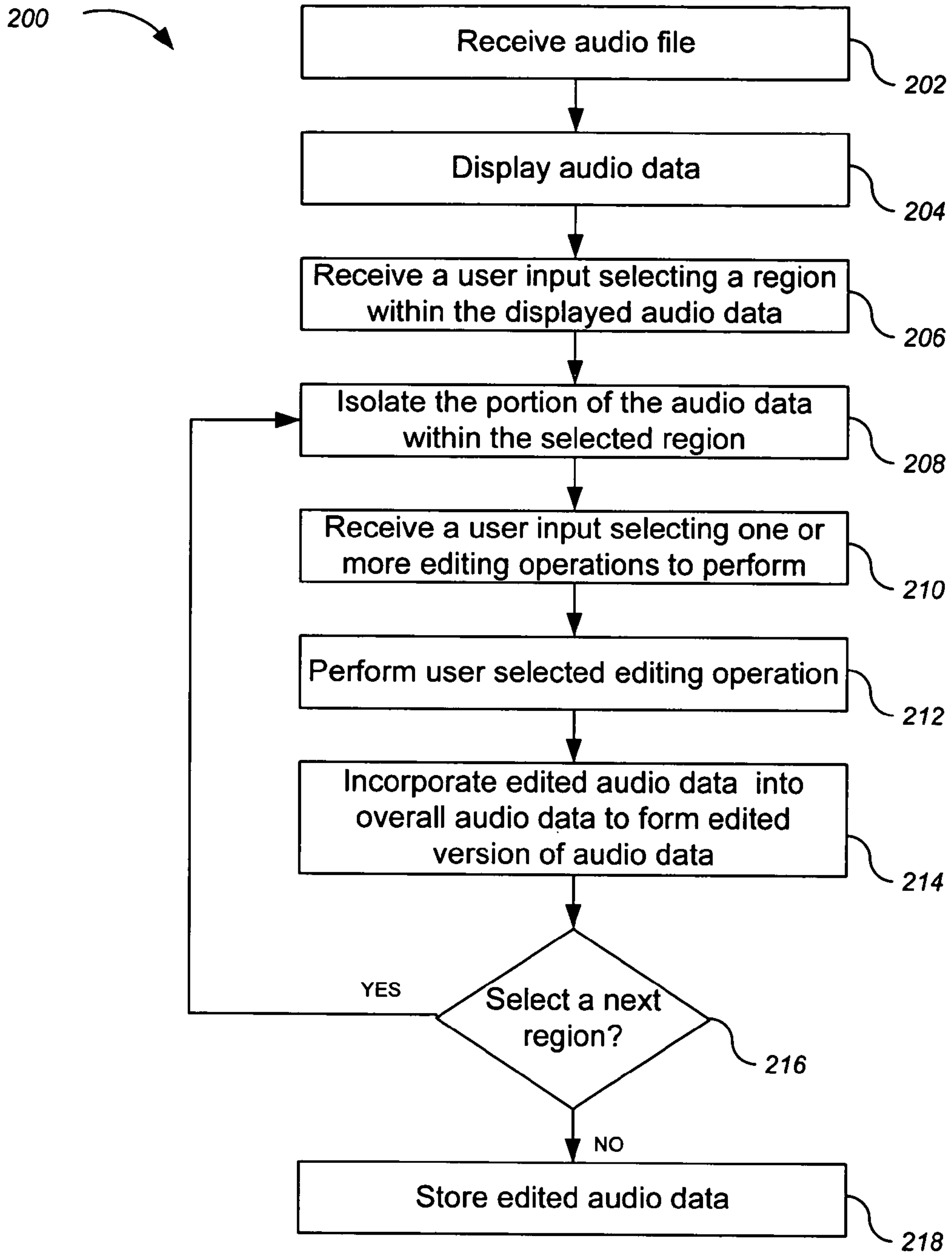
FIG. 2 shows an example process for editing audio data.

FIG. 2 shows an example process 200 for editing audio data. An audio file is received (e.g., from audio storage 110) (step 202). The audio file is received, for example, in response to a user selection of a particular audio file to edit.

Audio data of the received audio file is displayed visually (step 204). The audio data is displayed, for example, in a window of a graphical user interface (e.g., user interface 104). The audio data is displayed in a particular display format illustrating particular properties of the audio data. In one implementation of the user interface, for example, the audio data is displayed as a frequency spectrogram. While the editing method and associated example figures described below show the editing of a frequency spectrogram display format, the method is applicable to other display formats such as an amplitude display format. In one implementation, the user can select the display format for displaying the audio data.

Figure 3:
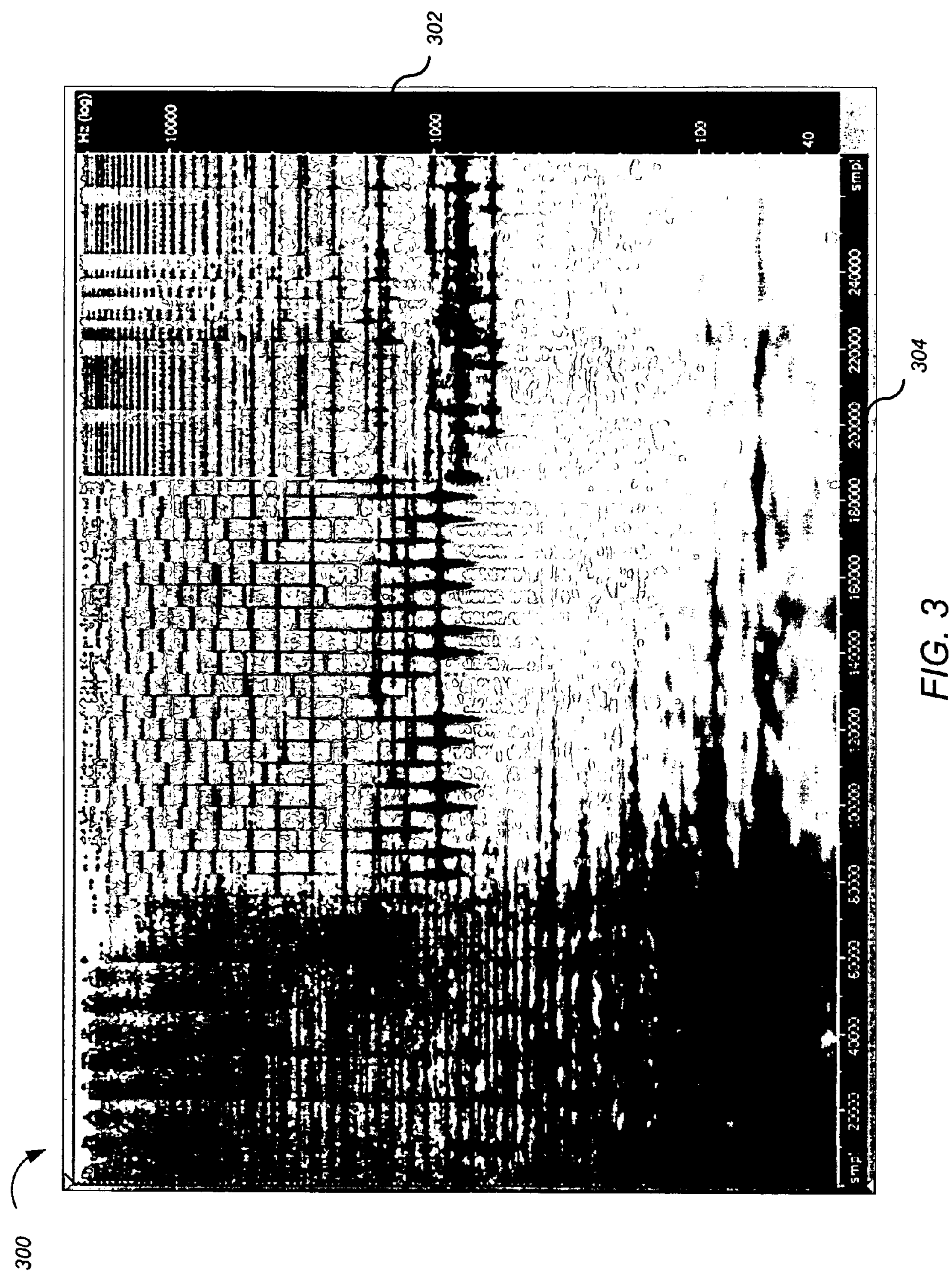
FIG. 3 shows an example frequency spectrogram display of audio data.

FIG. 3 shows an example frequency spectrogram display 300 of audio data. The frequency spectrogram display 300 shows the frequency components of the audio data in a frequency-time domain. Thus, the frequency spectrogram display 300 identifies the individual frequency components within the audio data at any particular point in time. In the frequency spectrogram 300, the y-axis 302 displays frequency in hertz. In the y-axis 302, frequency is shown in a logarithmic scale having a range from zero to greater than 10,000 Hz. However, frequency data can alternatively be displayed with linear or other scales as well as other frequency ranges.

Time is displayed on the x-axis 304. Specifically, the x-axis 304 identifies a total number of samples taken. A sample is a snapshot of audio data. The sample rate, therefore, is the number of individual samples taken from the audio data per unit time (e.g., samples per second). The higher the sample rate, the greater accuracy in reproducing all of the frequencies of a given digital audio (e.g., sample rates of substantially 44,000 samples per second correspond to CD quality audio). Thus, for a given sample rate, the number of total samples also defines the total elapsed time.

In one implementation of the user interface, the user can zoom in or out of either axis of the displayed frequency spectrogram independently such that the user can identify particular frequencies over a particular time range. The user zooms in or out of each axis to modify the scale of the axis and therefore increasing or decreasing the range of values for the displayed audio data. The displayed audio data is changed to correspond to the selected frequency and time range. For example, a user can zoom in to display the audio data corresponding to a small frequency range of only a few hertz. Alternatively, the user can zoom out in order to display the entire audible frequency range.

As shown in FIG. 2, the user provides an input selecting a region within the displayed audio data (step 204). The region need not be contiguous. The user selection is made, for example, using a selection tool in the user interface. For audio data displayed as a frequency spectrogram, the selected region demarcates an arbitrary region of the audio display defining a portion of the audio data in the frequency-time domain. The arbitrary region can be any shape including symmetric, asymmetric, and amorphous shapes. For example, the user can use a lasso tool to draw any arbitrary shape within the frequency spectrogram display, in which the range of frequencies selected can vary over the selected time range (i.e., a non-rectangular region). Thus, the selected region can have a variable height corresponding to audio data over a varying frequency range.

In one implementation, the region bound by the user selection tool is converted into an image defining a selection region for use in isolating the portion of the audio data corresponding to the selection region. In one implementation, for a color frequency spectrogram, the image is a grayscale image. The image defines a two dimensional mask (i.e., time vs. frequency), which is a bitmap demarcating the selection region. Because the mask is a bitmap, any arbitrary shape can be used to define a selection region. Additionally, the user can import one or more predefined shapes from another application, such as a graphics application, in order to select a particular shaped region in the audio data.

The user selection of a particular shaped region of the displayed audio data can be created to capture a particular portion of the audio data. For example, the user can identify particular noise components within the audio data. The user can then select a region surrounding the identified noise components. Alternatively, the user can select an arbitrary region of the displayed audio data which tracks a particular audio component, which may move through a number of different frequencies over a given period of time. For example, if the user identifies audio components of the frequency spectrogram that track a particular audio source (e.g., a musical instrument our other audio source), which is capable of generating a number of different frequencies, then the selected region can be defined to track those particular source components. Thus, the arbitrary region is not limited to constant frequencies, in contrast to a rectangular selection region defined over a constant frequency range.

Figure 4:
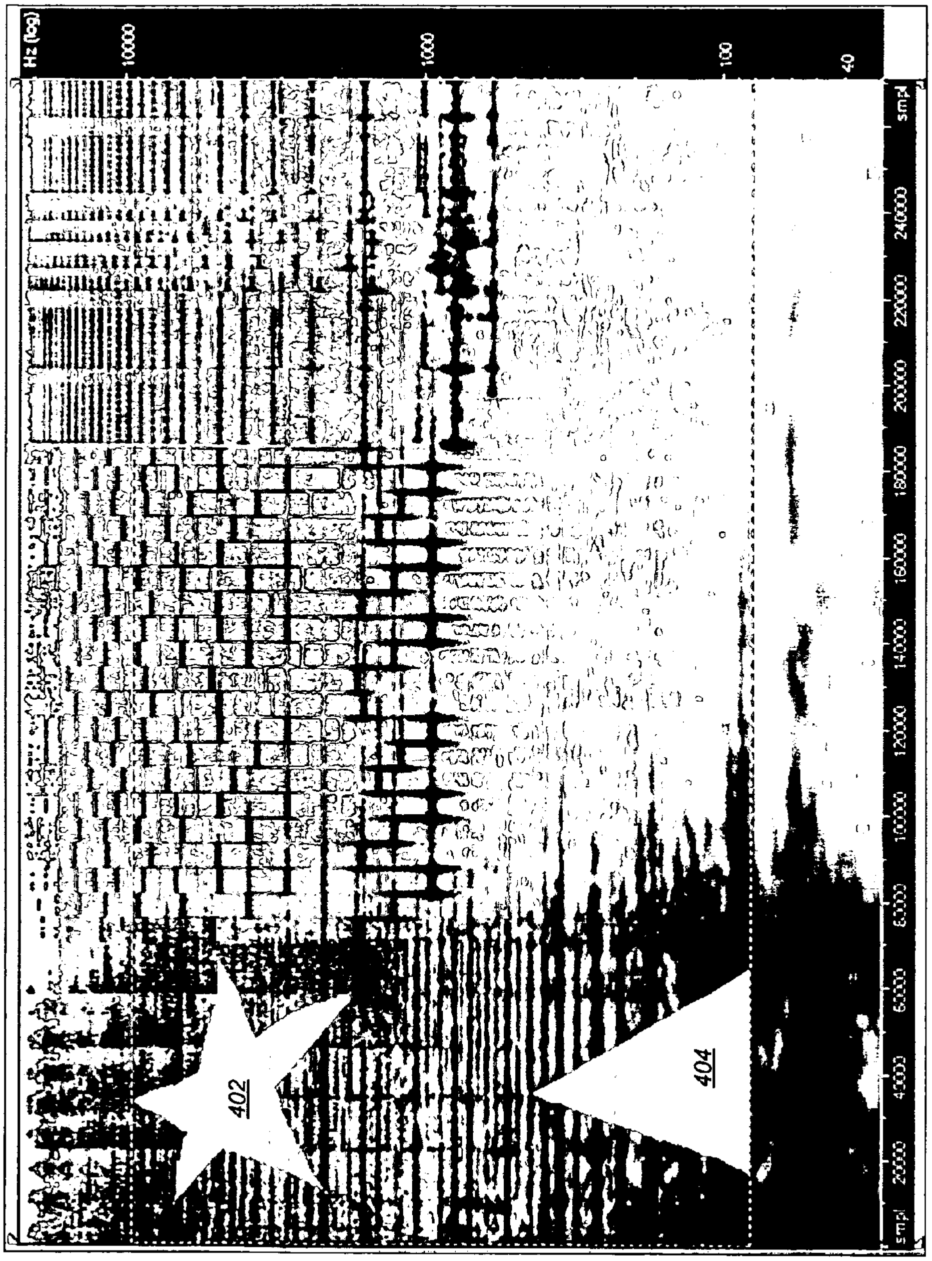
FIG. 4 shows the frequency spectrogram display of FIG. 3 including two example arbitrary selection regions of the displayed audio data.

FIG. 4 shows the frequency spectrogram display 300 of FIG. 3 including two examples of arbitrary selection regions 402 and 404 of the audio data. In FIG. 4, as in FIG. 3, the frequency spectrogram display 300 shows audio data defined in the frequency-time domain. Each selection region 402 and 404 demarcates an arbitrary region within the frequency spectrogram display 300. Specifically, selection region 402 demarcates a region having roughly a star shape. Selection region 404, in contrast, demarcates a region having roughly a triangular shape. As discussed above, the selection regions 402 and 404 are shown in the frequency spectrogram display 300 as bitmap images positioned on the displayed audio data. The selection regions 402 and 404 can be the result of a user drawing using a selection tool or can be the result of an imported mask imported from another application.

Figure 5:
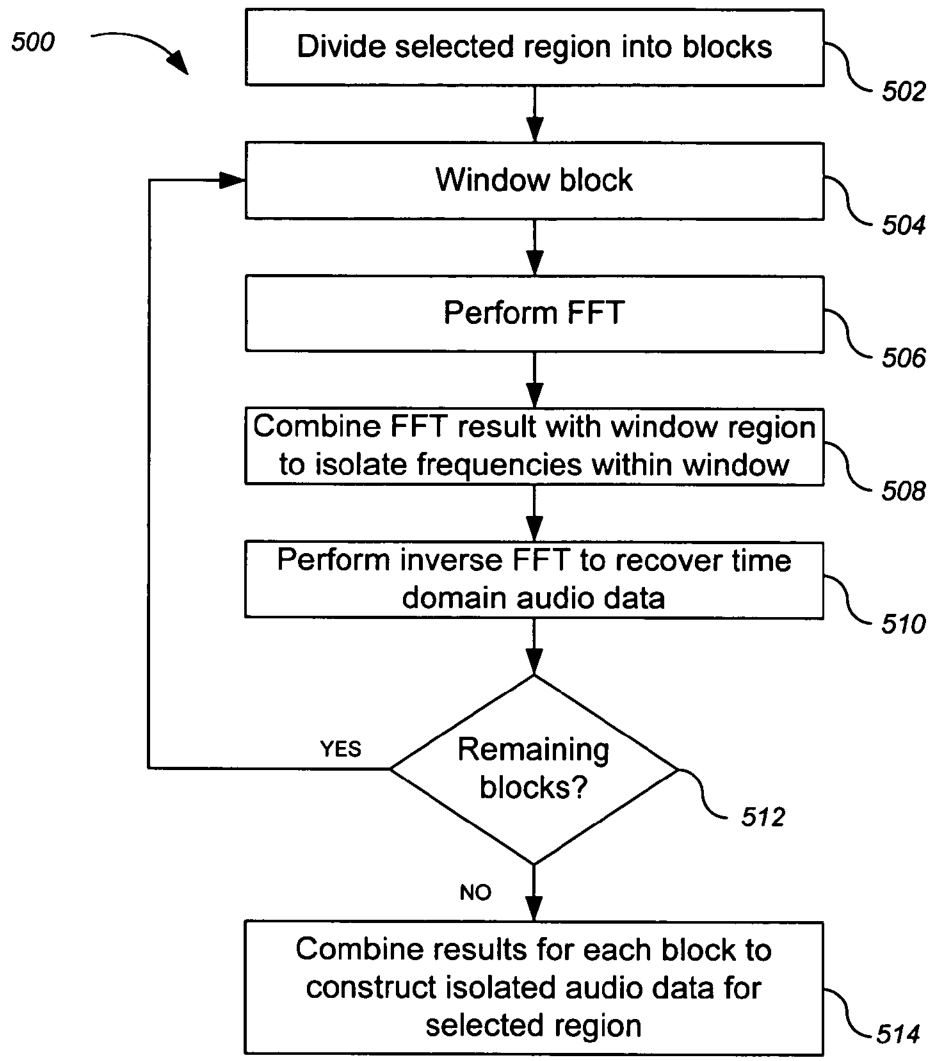
FIG. 5 shows an example process for isolating the audio data within a selection region.

As shown in FIG. 2, after the region within the displayed audio data has been selected, the portion of the audio data corresponding to selection region is isolated (step 208). The portion of the audio data is isolated to perform editing operations only on the audio data contained within that particular portion of the audio data. FIG. 5 shows an example process 500 for isolating the portion of the audio data corresponding to a user selected region of the displayed audio data.

The selected region is first divided into a series of blocks (step 502). In one implementation, the blocks are rectangular units, each having a uniform width (block width) in units as a function of time. The amount of time covered by each block is selected according to the type of block processing performed. For example, when processing the block according to a Short Time Fourier Transform method, the block size is small (e.g., 10 ms). Additionally, the height of each block is designed to match the contours of the selected region such that each block substantially matches the frequency range of the selected region for the period of time covered by the block.

In one method for creating blocks, each successive block partially overlaps the previous block along the x-axis (i.e., in the time-domain). This is because the block processing using Fourier Transforms typically has a greater accuracy at the center of the block and less accuracy at the edges. Thus, by overlapping blocks, the method compensates for reduced accuracy at block edges.

Each block is then processed to isolate audio data within the block. For simplicity, the block processing steps are described below for a single block as a set of serial processing steps, however, multiple blocks can be processed substantially in parallel (e.g., a particular processing step can be performed on multiple blocks prior to the next processing step).

The block is windowed (step 504). The window for a block is a particular window function defined for each block. A window function is a function that is zero valued outside of the region defined by the window (e.g., a Blackman-Harris window). Thus, by creating a window function for each block, subsequent operations on the block are limited to the region defined by the block. Therefore, the audio data within each block can isolated from the rest of the audio data using the window function.

A Fast Fourier Transform ("FFT") is performed to extract the frequency components of a vertical slice of the audio data over a time corresponding to the block width (step 506). The Fourier Transform separates the individual frequency components of the audio data from zero hertz to the Nyquist frequency. The window function of the block is applied to the FFT results (step 508). Because of the window function, frequency components outside of the block are zero valued. Thus, combining the FFT results with the window function removes any frequency components of the audio data that lie outside of the defined block.

An inverse FFT is then performed on the extracted frequency components for the block to reconstruct the time domain audio data solely from within the each block (step 510). However, since the frequency components external to the bock were removed by the window function, the inverse FFT creates isolated time domain audio data result that corresponds only to the audio components within the block.

Additional blocks are similarly processed (step 512). Thus, a set of isolated audio component blocks are created. The inverse FFT results from each block are then combined to construct isolated audio data corresponding to the portion of the audio data within the selected region (step 514). The results are combined by overlapping the set of isolated audio component blocks in the time-domain. As discussed above, each block partially overlaps the adjacent blocks. In one implementation, to reduce unwanted noise components at the edges of each block, the set of isolated audio component blocks can first be windowed to smooth the edges of each block. The windowed blocks are then overlapped to construct the isolated audio data.

In other implementations, the selection region of an audio data is isolated using other techniques. For example, instead of Fourier transforms, one or more dynamic zero phase filters can be used. A dynamic filter, in contrast to a static filter, changes the frequency pass band as a function of time, and therefore can be configured to have a pass band matching the particular frequencies present in the selected region at each point in time. Thus, dynamic filtering can be performed to isolate the audio data of a selection region in a display of audio data.

Figure 6:
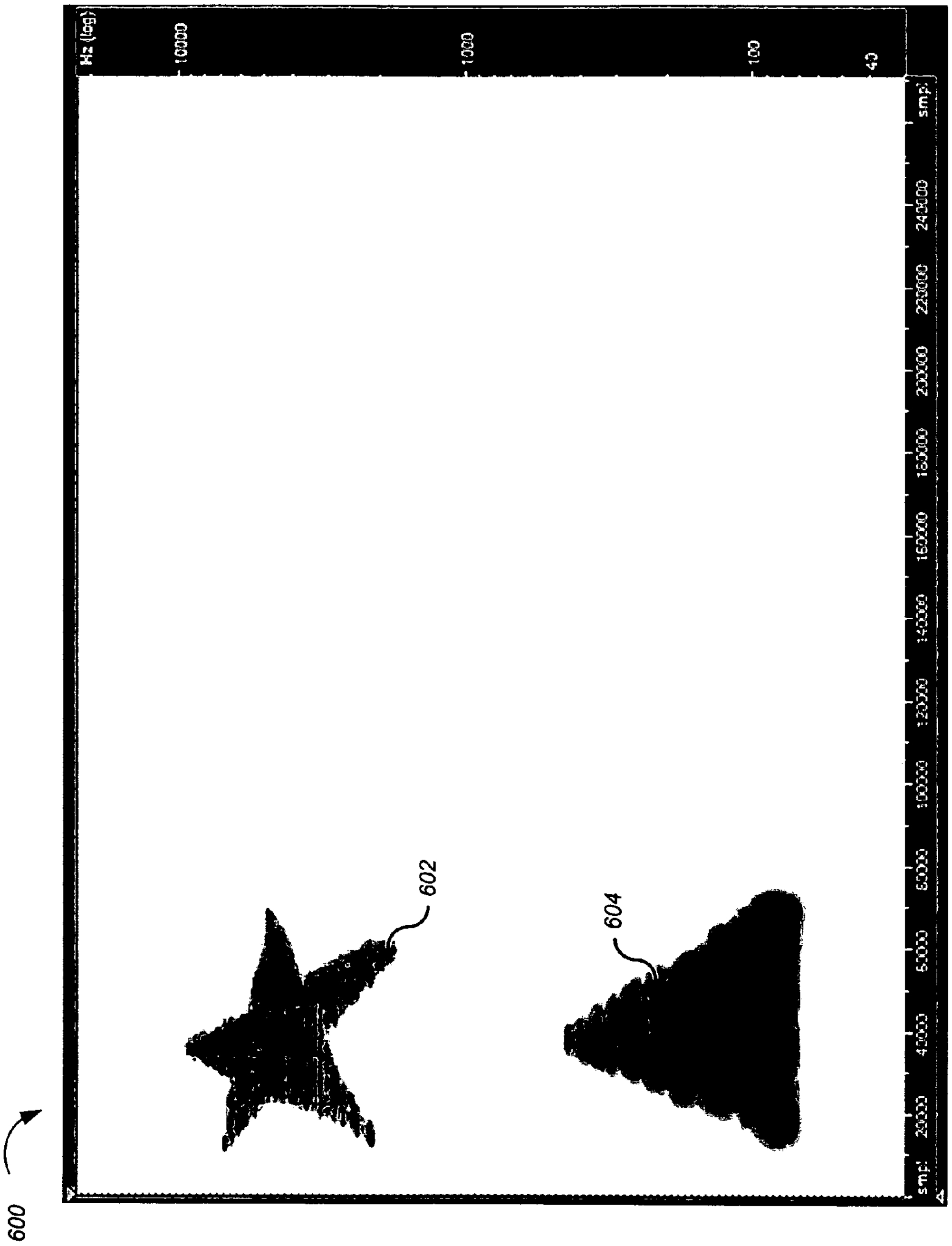
FIG. 6 shows an example of isolated audio data derived from the selection regions of the displayed audio data.

FIG. 6 shows isolated audio data 602 and 604 from the selected regions of the frequency spectrogram display 300 (FIG. 4). The isolated audio data 602 and 604 represents isolated audio data resulting from the block processing described above. The isolation process provides isolated audio data matching any arbitrarily selected regions within the displayed audio data. Thus, the isolated audio data 602 and 604 have a size and shape matching the selection regions 402 and 404 selected by the user.

As shown in FIG. 2, after isolating the portion of the audio data within selected region of the audio data, the user provides an input selecting one or more editing operations to perform (step 210). In one implementation, the user interface includes one or more tools or menu items including editing effects that can be performed on the isolated audio data.

The selection of particular editing effects can generate a dialog box including additional user input parameters to further define the editing effect. For example, a dialog box can be generated for providing user input parameters for setting the duration of a time domain effect (e.g., an echo effect) or a frequency range for a frequency modifying effect (e.g., pitch scaling).

The user selected editing operations are performed on the isolated audio data (step 212). Example effects, which can be performed on the isolated audio data, include amplifying, pitch shifting, flanging, echo, reversing, and attenuating. For example, a pitch shifting effect can be applied to adjust the pitch of the audio data within the isolated region without modifying the time associated with the audio data. A flanging effect is a time domain effect that applies an audio feedback signal identical to the isolated audio data, except that the applied signal is time delayed by a small amount (e.g., 10 ms). An echo effect is similar to the flanging effect, except that the time delay of the feedback signal is longer (e.g., more than 50 ms) and the intensity of each successively decreases with each "echo".

Additionally, stereo effects can be applied to the isolated audio data including channel mixing/swapping, center channel extraction, panning, and stereo field rotation. A dynamic compressor or expander can also be applied a selection of a specified frequency range within the audio data. Other effects applied to the isolated audio data can include restoration effects, which removes unwanted portions of the audio data such as noise components.

Figure 7:
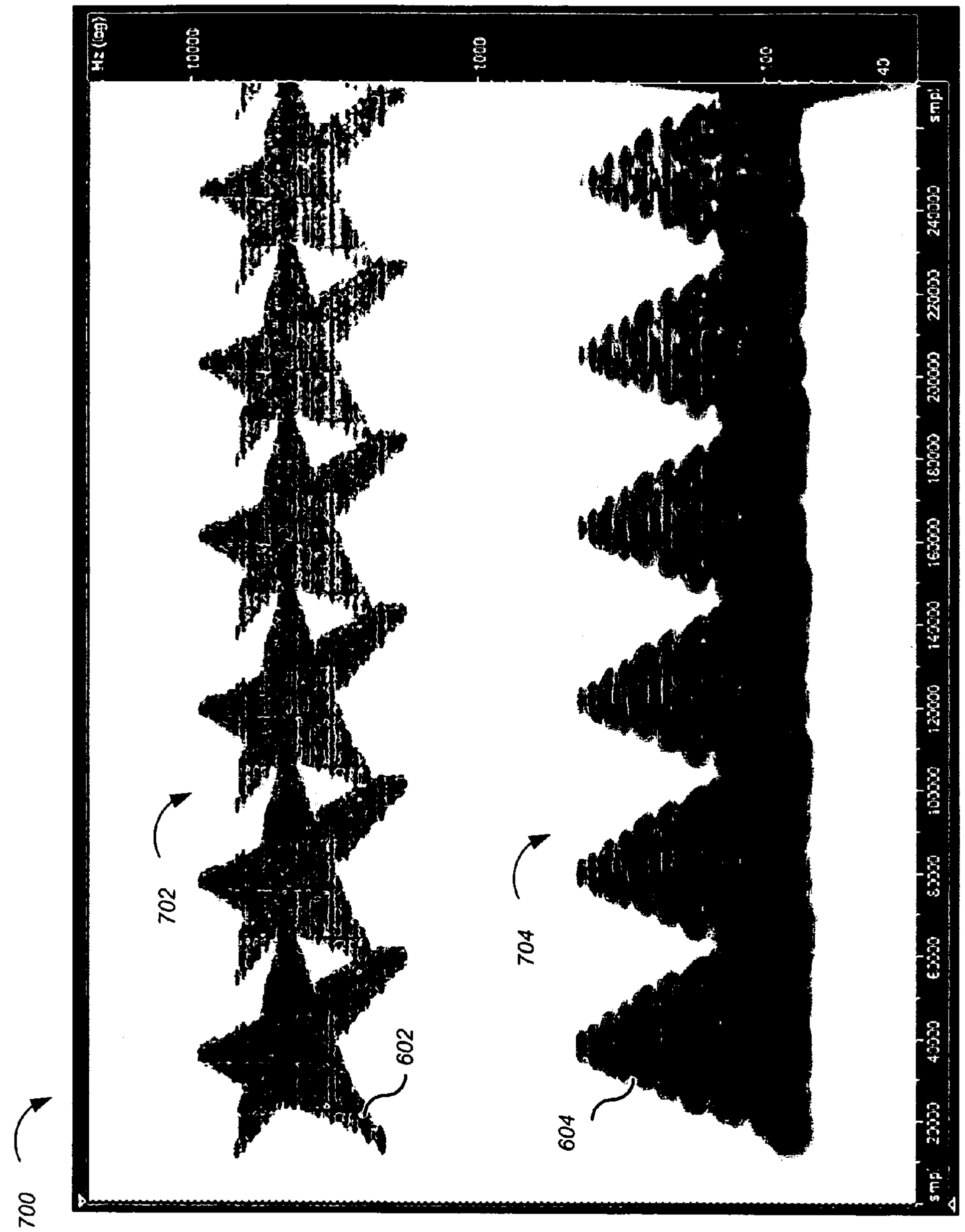
FIG. 7 shows an edited version of the isolated audio data of FIG. 6.

FIG. 7 shows an edited version 700 of the isolated audio data shown in FIG. 6. The edited version 700 includes the isolated audio data 602 and 604 as well as audio data providing an echo effect. Echo components 702 are successive versions of the isolated audio data 602, which are repeated over time with gradually decreasing intensity in order to provide the echo effect. Similarly, echo components 704 are successive versions of the isolated audio data 604, which are repeated over time with gradually decreasing intensity in order to provide the echo effect.

As shown in FIG. 2, the edited portion of the audio data is then mixed into the original displayed audio data to form an edited version of the original audio data (step 214). In one implementation, to mix the edited portions of the audio data back into the original audio data, the portion of the audio data from the selected region is first subtracted from the original audio data. This can be done contemporaneously with isolating the selection region or can be done at any time prior to mixing the edited audio data back into the original audio data. Subtracting the portion of the audio data from the selected region can include directly subtracting the sample point values of the audio data of the selected region from the sample point values of the original audio data in the time-domain.

Figure 8:
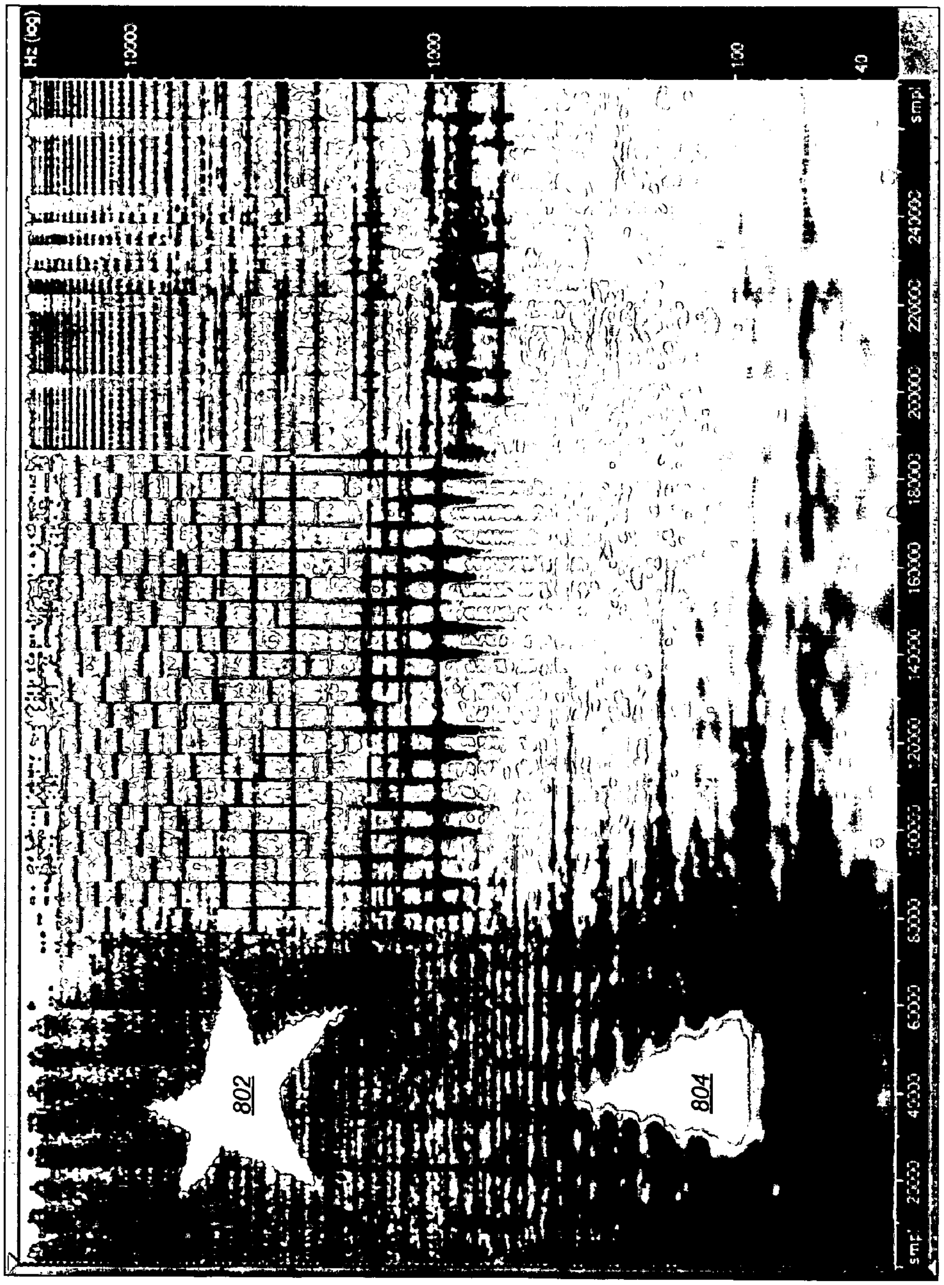
FIG. 8 shows an example frequency spectrogram display with the portion of the audio data contained within the two selection regions subtracted from the audio data.

FIG. 8 shows an example frequency spectrogram display 800 with the portion of the audio data corresponding to the selected regions subtracted. In FIG. 8, the frequency spectrogram display 800 includes subtracted regions 802 and 804. The subtracted regions 802 and 804 show regions of the displayed audio data in which all audio data within by the subtracted regions 802 and 804 have been removed.

Figure 9:
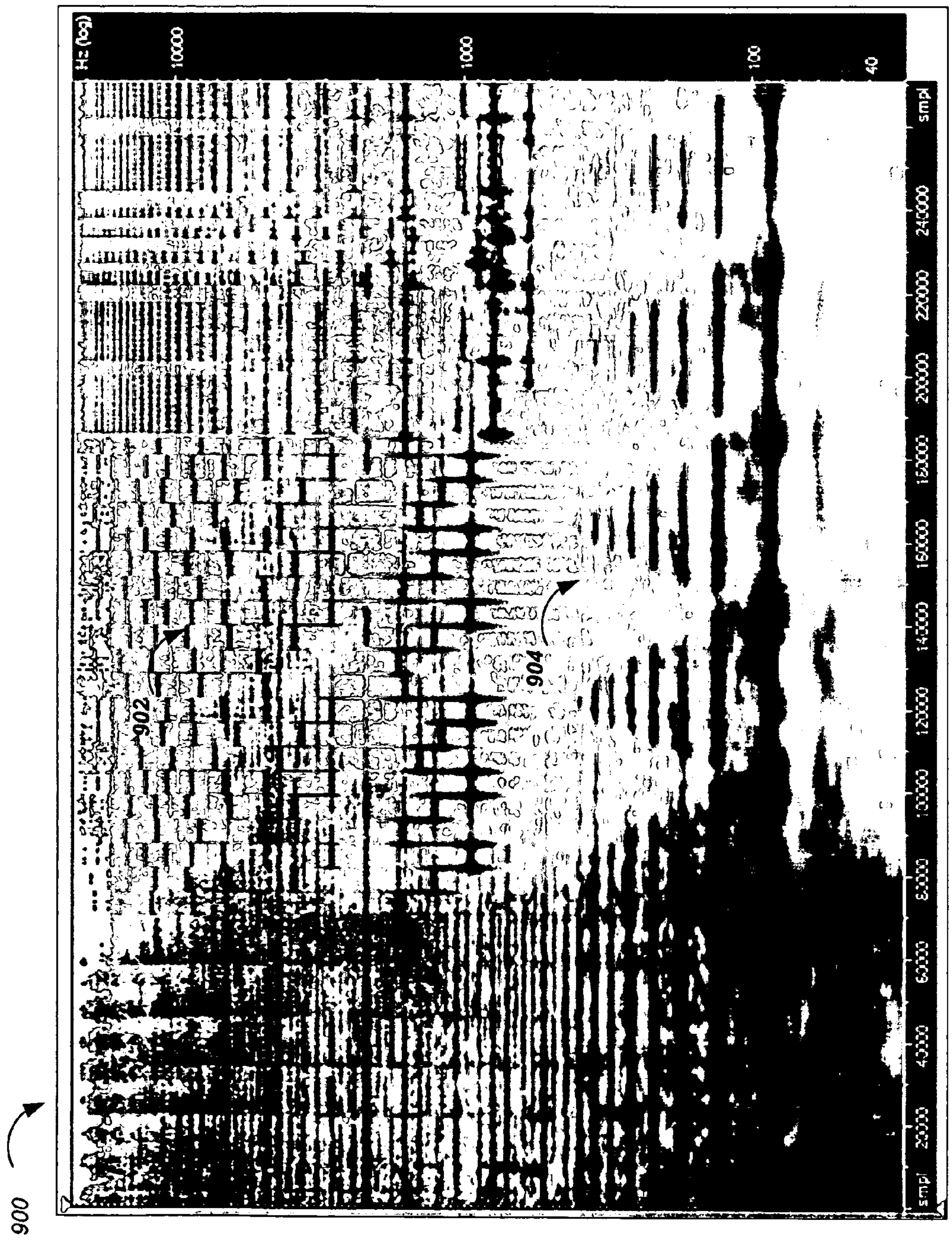
FIG. 9 shows an example frequency spectrogram display including edited audio data.

After subtracting the portion of the audio data corresponding to the selected regions of the original audio data, the edited audio data are then mixed into the remaining original audio data to create a single edited version of the audio data. FIG. 9 shows an example frequency spectrogram 900 including the edited version of the audio data. In FIG. 9, the frequency spectrogram 900 includes edited portions of the audio data 902 and 904 mixed into the original audio data shown in FIG. 8. Mixing the original audio data and the edited audio data includes directly summing the sample point values in the time-domain. The edited portions of the audio data 902 and 904 provide the echo effect shown by the edited audio components 702 and 704 in FIG. 7.

Alternatively, the subtraction of the portion of the audio data located at the selected region can be the desired effect (e.g., performing an edit to remove unwanted noise components of the audio data). Thus, the subtraction of the isolated audio data from the audio data provides the edited effect. Additionally, the edited portion of the audio data can be pasted to a different area of the displayed audio data either in place of the original portion of the audio data of the selected region or in addition to the original portion of the audio data of the selected region.

The user can optionally select and edit additional selection regions within the displayed audio data (step 216). The additional selection regions are processed and edited in a manner similar to that described above. Once the user has completed editing operations, the edited audio file can be saved and stored for playback, transmission, or other uses (step 218).

In one implementation, the audio editing system includes preview functionality which allows the user to preview the edited audio results prior to mixing the edited audio data into the original audio data. Additionally, the system also can include an undo operation allowing the user undo performed audio edits, for example, which do not have the user intended results.

Embodiments of the invention and all of the functional operations described in this specification can be implemented in digital electronic circuitry, or in computer software, firmware, or hardware, including the structures disclosed in this specification and their structural equivalents, or in combinations of one or more of them. Embodiments of the invention can be implemented as one or more computer program products, i.e., one or more modules of computer program instructions encoded on a computer-readable medium for execution by, or to control the operation of, data processing apparatus. The computer-readable medium can be a machine-readable storage device, a machine-readable storage substrate, a memory device, a composition of matter effecting a machine-readable propagated signal, or a combination of one or more them. The term “data processing apparatus” encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the invention can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the invention, or any combination of one or more such back-end, middleware, or front-end components. The components of the system can be interconnected by any form or medium of digital data communication, e.g., a communication network. Examples of communication networks include a local area network (“LAN”) and a wide area network (“WAN”), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understand as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. For example, the actions recited in the claims can be performed in a different order and still achieve desirable results. Additionally, in other implementations, the data is not audio data. Other data, which can be displayed as frequency over time, can also be used. For example, other data can be displayed in a frequency spectrogram including seismic, radio, microwave, ultrasound, light intensity, and meteorological (e.g., temperature, pressure, wind speed) data. Consequently, regions of the displayed data can be similarly selected and edited as discussed above. Also, a display of audio data other than a frequency spectrogram can be used.

What is claimed is:

1. A computer-implemented method, comprising:

receiving a user input demarcating an arbitrary region within a visual display of audio data, where the arbitrary region has a boundary with respect to frequency and time such that a bounded range of frequencies varies with respect to time;

isolating a portion of the audio data, the portion corresponding to the region demarcated by the user input;

editing the isolated portion of the audio data; and mixing the edited portion of the audio data into the audio data to create edited audio data.

2. The method of claim 1, where isolating the portion of the audio data comprises:

dividing the region into blocks;

processing each block, including:

defining a window function for the block;

performing a Fourier transform on the audio data over the time of the block to extract frequency components;

applying the window to the Fourier transform results to remove extracted frequency components external to the block;

performing an inverse Fourier transform to provide a time domain isolated block audio data corresponding only to the audio data of the block;

combining the isolated block audio data for each block to generate the isolated audio data for the demarcated region.

3. The method of claim 2, where dividing the demarcated regions into blocks includes creating overlapping rectangular blocks having a predefined width in time and a height corresponding to the frequency range of the demarcated region at that time.

4. The method of claim 2, where windowing the block defines a function that is zero-valued outside the boundary of the window.

5. The method of claim 4, where the window boundary substantially matches the width of the block and the height of the demarcated region for block time.

6. The method of claim 5, where applying the window function to the Fourier transform results removes all frequency components of the audio data outside the defined window.

7. The method of claim 1, where displaying the audio data includes generating a frequency spectrogram display.

8. The method of claim 1, where editing the isolated audio data includes applying one or more effects to the isolated audio data.

9. The method of claim 1, where mixing the edited isolated audio data includes:

subtracting the isolated audio data of the demarcated region from the displayed audio data; and adding the edited audio data into the displayed audio data.

10. The method of claim 1, where editing operations are performed directly within the display of the audio data.

11. A computer program product, encoded on a computer-readable storage medium, operable to cause data processing apparatus to perform operations comprising:

displaying audio data in a visual form;

receiving a user input demarcating an arbitrary region within the visual display of the audio data, where the arbitrary region has a boundary with respect to frequency and time such that a bounded range of frequencies varies with respect to time;

isolating a portion of the audio data, the portion corresponding to the region demarcated by the user;

editing the isolated portion of the audio data; and mixing the edited portion of the audio data into the audio data to create edited audio data.

12. The computer program product of claim 11, where isolating the portion of the audio data comprises:

dividing the region into blocks;

processing each block, including:

defining a window function for the block;

performing a Fourier transform on the audio data over the time of the block to extract frequency components;

applying the window to the Fourier transform results to remove extracted frequency components external to the block;

performing an inverse Fourier transform to provide a time domain isolated block audio data corresponding only to the audio data of the block;

combining the isolated block audio data for each block to generate the isolated audio data for the demarcated region.

13. The computer program product of claim 12, where dividing the demarcated regions into blocks includes creating overlapping rectangular blocks having a predefined width in time and a height corresponding to the frequency range of the demarcated region at that time.

14. The computer program product of claim 12, where windowing the block defines a function that is zero-valued outside the boundary of the window.

15. The computer program product of claim 14, where the window boundary substantially matches the width of the block and the height of the demarcated region for block time.

16. The computer program product of claim 15, where applying the window function to the Fourier transform results removes all frequency components of the audio data outside the defined window.

17. The computer program product of claim 11, where displaying the audio data includes generating a frequency spectrogram display.

18. The computer program product of claim 11, where editing the isolated audio data includes applying one or more effects to the isolated audio data.

19. The computer program product of claim 11, where mixing the edited isolated audio data includes:

subtracting the isolated audio data of the demarcated region from the displayed audio data; and adding the edited audio data into the displayed audio data.

20. The computer program product of claim 11, where editing operations are performed directly within the display of the audio data.

21. A computer-implemented method, comprising:

receiving a selection of an arbitrary region within a visual display of audio data, where the arbitrary region has a boundary with respect to frequency and time such that a bounded range of frequencies varies with respect to time;

isolating a portion of the audio data, the portion corresponding to the selected arbitrary region;

editing the isolated portion of the audio data; and mixing the edited portion of the audio data into the audio data to create edited audio data.

22. An apparatus, comprising:

a display region for displaying audio data of an audio file;

one or more selection tools for selecting an arbitrary region within a particular displayed audio data, where the arbitrary region has a boundary with respect to frequency and time such that a bounded range of frequencies varies with respect to time; and one or more editing tools for directly editing a portion of the audio data contained within the selected region of the displayed audio data.

23. A system comprising:

one or more processors configured to perform operations including:

receiving a user input demarcating an arbitrary region within a visual display of audio data, where the arbitrary region has a boundary with respect to frequency and time such that a bounded range of frequencies varies with respect to time;

isolating a portion of the audio data, the portion corresponding to the region demarcated by the user input;

editing the isolated portion of the audio data; and mixing the edited portion of the audio data into the audio data to create edited audio data.

24. The system of claim 23, where isolating the portion of the audio data comprises:

dividing the region into blocks;

processing each block, including:

defining a window function for the block;

performing a Fourier transform on the audio data over the time of the block to extract frequency components;

applying the window to the Fourier transform results to remove extracted frequency components external to the block;

performing an inverse Fourier transform to provide a time domain isolated block audio data corresponding only to the audio data of the block;

combining the isolated block audio data for each block to generate the isolated audio data for the demarcated region.

25. The system of claim 24, where dividing the demarcated regions into blocks includes creating overlapping rectangular blocks having a predefined width in time and a height corresponding to the frequency range of the demarcated region at that time.

26. The system of claim 24, where windowing the block defines a function that is zero-valued outside the boundary of the window.

27. The system of claim 26, where the window boundary substantially matches the width of the block and the height of the demarcated region for block time.

28. The system of claim 27, where applying the window function to the Fourier transform results removes all frequency components of the audio data outside the defined window.

29. The system of claim 23, where displaying the audio data includes generating a frequency spectrogram display.

30. The system of claim 23, where editing the isolated audio data includes applying one or more effects to the isolated audio data.

31. The system of claim 23, where mixing the edited isolated audio data includes:

subtracting the isolated audio data of the demarcated region from the displayed audio data; and adding the edited audio data into the displayed audio data.

32. The system of claim 23, where editing operations are performed directly within the display of the audio data.

33. A computer program product, encoded on a computer-readable storage medium, operable to cause data processing apparatus to perform operations comprising:

receiving a selection of an arbitrary region within a visual display of audio data, where the arbitrary region has a boundary with respect to frequency and time such that a bounded range of frequencies varies with respect to time;

isolating a portion of the audio data, the portion corresponding to the selected arbitrary region;

editing the isolated portion of the audio data; and mixing the edited portion of the audio data into the audio data to create edited audio data.

34. A system comprising:

one or more processors configured to perform operations comprising:

receiving a selection of an arbitrary region within a visual display of audio data, where the arbitrary region has a boundary with respect to frequency and time such that a bounded range of frequencies varies with respect to time;

isolating a portion of the audio data, the portion corresponding to the selected arbitrary region;

editing the isolated portion of the audio data; and mixing the edited portion of the audio data into the audio data to create edited audio data.

* * * * *

UNITED STATES PATENT AND TRADEMARK OFFICE

CERTIFICATE OF CORRECTION

PATENT NO. : 7,640,069 B1
APPLICATION NO. : 11/395044
DATED : December 29, 2009
INVENTOR(S) : David E. Johnston It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 548 days.

Signed and Sealed this

Ninth Day of November, 2010

David J. Kappos

*Director of the United States Patent and Trademark Office*